United States Patent
Goldberg

(10) Patent No.: US 6,995,097 B1
(45) Date of Patent: Feb. 7, 2006

(54) METHOD FOR THERMAL NITRIDATION AND OXIDATION OF SEMICONDUCTOR SURFACE

(75) Inventor: Richard Todd Goldberg, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1521 days.

(21) Appl. No.: 09/085,298

(22) Filed: May 27, 1998

(51) Int. Cl.
*H01L 21/31* (2006.01)
*H01L 21/469* (2006.01)

(52) U.S. Cl. ............... 438/786; 438/788; 438/792; 438/771; 438/776

(58) Field of Classification Search ........ 438/792, 438/791, 238, 239, 775–777, 768–772, 765, 438/786–788
See application file for complete search history.

(56) References Cited

U.S. PATENT DOCUMENTS

| | | | |
|---|---|---|---|
| 4,298,629 A | * | 11/1981 | Nozaki et al. ............ 427/39 |
| 4,343,657 A | * | 8/1982 | Ito et al. .................. 148/1.5 |
| 4,910,043 A | * | 3/1990 | Freeman et al. ......... 427/39 |
| 5,612,249 A | * | 3/1997 | Sun et al. ................. 438/69 |
| 5,643,819 A | * | 7/1997 | Tseng ....................... 438/60 |
| 5,719,410 A | * | 2/1998 | Suehiro et al. ........... 257/77 |
| 5,721,174 A | * | 2/1998 | Peidous .................... 438/445 |
| 5,872,385 A | * | 2/1999 | Taft et al. ................. 257/437 |
| 5,946,542 A | * | 8/1999 | Iyer ........................... 438/7 |

* cited by examiner

*Primary Examiner*—Amir Zarabian
*Assistant Examiner*—Khanh Duong
(74) *Attorney, Agent, or Firm*—Jacqueline J. Garner; W. James Brady, III; Frederick J. Telecky, Jr.

(57) ABSTRACT

An embodiment of the instant invention is a method of forming a dielectric layer on a silicon-containing structure, the method comprising the steps of: providing a nitrogen-containing gas; heating the silicon-containing structure to an elevated temperature which is greater than 700 C; and striking a plasma above the silicon-containing structure, wherein combination of the nitrogen-containing gas, the elevated temperature, and the plasma resulting in the thermal nitridation of a portion of the silicon-containing structure. Preferably, the elevated temperature is greater than 900 C (more preferably the elevated temperature is greater than 1000 C). The silicon-containing structure is, preferably, a silicon substrate or a bottom electrode of a storage capacitor of a memory device.

10 Claims, 2 Drawing Sheets

METHOD FOR THERMAL NITRIDATION AND OXIDATION OF SEMICONDUCTOR SURFACE

CROSS-REFERENCE TO RELATED PATENT/PATENT APPLICATIONS

This is a Non Provisional application filed under 35 USC 119(e) and claims priority of prior provisional, Ser. No. 60/048,212 of inventor Richard T. Goldberg, filed May 30, 1997.

The following commonly assigned patent/patent applications are hereby incorporated herein by reference:

| U.S. Pat. No./Ser. No. | Filing Date | TI Case No. |
| --- | --- | --- |
| 60/035,375 | Dec. 5, 1996 | TI-22980P |
| 60/019,429 | Jun. 7, 1996 | TI-23502P |

FIELD OF THE INVENTION

The instant invention pertains to semiconductor device fabrication and processing and more specifically to the novel formation of a gate dielectric layer or capacitor dielectric.

BACKGROUND OF THE INVENTION

Presently, there is a great demand for shrinking semiconductor devices to provide an increased density of devices on the semiconductor chip that are faster and consume less power. The scaling of the devices in the lateral dimension requires vertical scaling as well so as to achieve adequate device performance. This vertical scaling requires the thickness of the gate dielectric to be reduced so as to provide the required device performance. However, thinning of the gate dielectric provides a smaller barrier to dopant diffusion from a polysilicon gate structure or metal diffusion from a metal gate structure and through the underlying dielectric and it may result in devices with diminished electrical performance and reliability.

In addition, with this decrease in the physical thickness of the gate dielectric, device reliability will be degraded due to the requirements for increased direct tunneling current through the gate dielectric. In order to increase the effects of direct tunneling, a gate dielectric with a dielectric constant greater than that of the standard gate dielectric, thermally grown silicon dioxide, can be used. This will facilitate an increased gate dielectric thickness for a given gate dielectric area.

One means of reducing these problems is to use silicon nitride as the gate dielectric layer. Silicon nitride has a higher dielectric constant than typical thermally grown $SiO_2$ films and it provides greater resistance to impurity diffusion. However, the electrical properties of standard deposited silicon nitride films are far inferior to thermal oxides. Hence, to make the conventional silicon nitride film useful as a gate insulator, an oxide layer must be formed between the nitride layer and the substrate.

Recently, a technique was developed for depositing a silicon nitride film that has electrical properties similar to that of typical silicon oxide films. This new technique is referred to as Jet Vapor Deposition (JVD). See Xie-wen Wang, et al., *Highly reliable Silicon Nitride Thin Films Made by Jet Vapor Deposition*, JPN. J. APPL. PHYS., Vol. 34, 955–958 (1995). JVD relies on a supersonic jet of a light carrier gas, such as helium, to transport deposition vapor from the source to the substrate. While this technique yields a silicon nitride film that can be used as a gate dielectric, it suffers from the following problems: it is a relatively complex process which involves rastering the plasma jet across the wafer so as to deposit the film on the entire wafer (and this is difficult to reliably accomplish); this process can not be easily scaled up for broad-area film formation on large diameter wafers (e.g. 8–12 inch wafers); hydrogen is incorporated into the resultant film; and this process is a low throughput process because of the tremendously slow deposition rates. In addition, most CVD-type techniques yield a high density of surface electrical interface states, high leakage, and instabilities. All of these problems have adverse affects to device performance.

Another method of maintaining the benefit of the electrical properties of the oxide film while also getting the barrier properties of a nitride film is accomplished by incorporating nitrogen into a gate oxide layer. Typically, this is accomplished by a reoxidized nitrided oxide process. This process involves using ammonia to include nitrogen within the gate oxide layer. Unfortunately, in order to get the ammonia to penetrate the gate oxide, temperatures in excess of 1000 C are required. In addition, once the high temperature reaction has begun, it is difficult to control the concentration of the nitrogen incorporated into the gate oxide. Excessive nitrogen near the interface between the semiconductor substrate and the gate oxide can adversely affect the threshold voltage and degrade the channel mobility of the device through Coloumbic effects of the fixed charge and interface-trap charge associated with the nitrogen on the carriers within the channel region.

Other experimental work has been done involving nitridation through exposure to a remote plasma. See S. V. Hattangady, et al., *Controlled Nitrogen Incorporation at the Gate Oxide Surface*, 66 Appl. Phys. Lett. 3495 Jun. 19, 1995). This process provided for nitrogen incorporation specifically at the gate-conductor interface using a high pressure (100 milliTorr) and low power (30 Watt) process with relatively low ion-density and ion flux. Low ion-density and ion-flux dictates a long duration (around 10–60 minute) so as to obtain desired concentration of incorporated nitrogen. This long exposure to the plasma increases the probability of charge-induced damage to the oxide.

SUMMARY OF THE INVENTION

Basically, the instant invention is a novel method and related equipment for the thermal nitridation of a semiconductor surface (Si, GaAS, or Ge) at a sufficiently high temperature in the presence of reactive nitrogen. The nitride dielectric formed using the instant invention will preferably have a dielectric constant around twice that of silicon dioxide and will have low direct tunneling leakage and good silicon-insulator interface properties. In addition, by providing reactive oxygen or other gas(es) while heating at higher temperatures, the method and equipment of the instant invention can also thermally oxidize, or provide other chemical surface treatment to a semiconductor surface.

An embodiment of the instant invention is a method of forming a dielectric layer on a silicon-containing structure, the method comprising the steps of: providing a nitrogen-containing gas; heating the silicon-containing structure to an elevated temperature which is greater than 700 C; and striking a plasma above the silicon-containing structure, wherein combination of the nitrogen-containing gas, the elevated temperature, and the plasma resulting in the thermal nitridation of a portion of the silicon-containing structure. Preferably, the elevated temperature is greater than 900 C (more preferably the elevated temperature is greater than 1000 C). The silicon-containing structure is, preferably, a silicon substrate or a bottom electrode of a storage capacitor of a memory device.

Another embodiment of the instant invention is a method of forming an electrical device which has a dielectric formed between a bottom structure and a top structure, the method comprising the steps of: providing the bottom structure; providing a nitrogen-containing gas over the bottom structure; heating the bottom structure at an ambient temperature which is at least 900 C; providing a plasma over the bottom structure to cause thermal nitridation of the bottom structure so as to form the dielectric over the bottom structure; and providing the top structure over the dielectric. The bottom structure is, preferably, a silicon substrate and the top structure is a gate structure or a bottom electrode of a storage capacitor of a memory device. Preferably, the ambient temperature is around 1000 C.

DETAILED DESCRIPTION OF THE DRAWINGS

Figure 1:
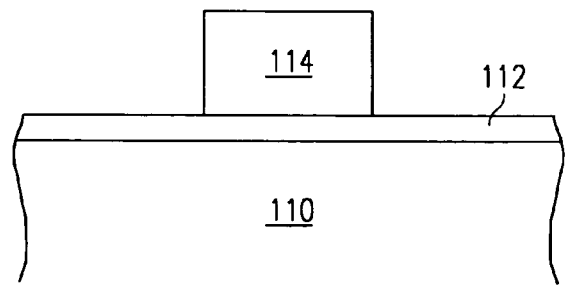
FIG. 1 is a cross-sectional view of a transistor which is fabricated with the thermal nitridation/oxidation method of the instant invention.

The following description is centered around three embodiments of the instant invention. While the description of both embodiments involve the novel formation of a gate dielectric, the instant methods are not limited to the formation of a gate dielectric layer. The instant embodiments can be utilized to form other layers required in the formation of semiconductor devices. For example, the instant invention can be utilized to form the dielectric material in a capacitor structure or it can be used to isolate conductive structures. While the following description describes the formation of a gate dielectric layer, one of ordinary skill in the art should be able to use the teachings of the following description and form other layers in a semiconductor device. Like reference numerals are utilized in the figures to illustrate like features or similar process steps.

Basically, the method of the instant invention involves forming thermal nitridation or oxidation layer by placing a wafer in a plasma chamber that has an internal ambient temperature of around 900–1000 C (or higher) and subjecting the wafer to either a nitrogen-containing gas or an oxygen-containing gas and plasma. The thermal nitridation or oxidation layers of the instant invention will have sufficient electrical and physical properties such that these layers can be used as capacitor dielectrics or gate dielectrics for high performance devices.

More specifically, the method of the instant invention involves providing an underlying semiconductive structure (like silicon substrate 110 or doped or undoped polysilicon bottom electrode 30 and 36) in which to form the nitridation or oxidation layer on. Next, the semiconductor wafer is placed in a plasma chamber and heated to at least 700 C (preferably at least 900 C, more preferably at least 950 C and even more preferably 1000 C or higher). This can be accomplished by heating the chuck which holds the wafer in place or by radiantly heating the wafer (preferably using heating lamps 302 within the processing chamber). A source of nitrogen and/or oxygen is supplied to the chamber. Preferably, the nitrogen source is either gaseous $N_2$ or any other nitrogen containing gas (preferably not ammonia) and the oxygen source is $O_2$. Next, a plasma is supplied into the chamber. The combination of the high temperature, the plasma and the source of nitrogen or oxygen forms a film on the wafer that is comprised of nitrogen and/or oxygen that has electrical and barrier properties that are sufficient for high performance memory devices (such as DRAMs), logic devices, digital signal processors, microprocessors, power transistors, and CMOS devices.

The transistor of FIG. 1 can be fabricated using the method of the instant invention. Thermal nitridation/oxidation layer 112 can be formed using the method of the instant invention. Preferably, gate dielectric layer 112 is formed on substrate 110 (which may be comprised of an epitaxial layer formed on the substrate—preferably comprised of silicon). Gate structure 114 is then formed on dielectric layer 112 using standard processing. Gate structure 114 may be comprised of polycrystalline silicon or a metal (preferably Ti, TiN, tungsten, or any other refractory metal).

Figure 2:
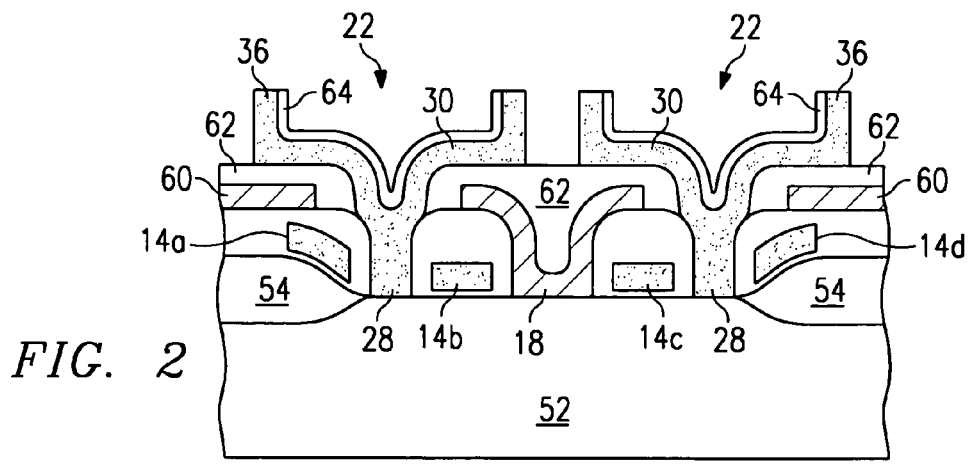
FIG. 2 is a cross-sectional view of a capacitor structure which is fabricated with the thermal nitridation/oxidation method of the instant invention.

The DRAM device structure of FIG. 2 can be fabricated using the method of the instant invention. More specifically, capacitor dielectric 64 can be fabricated using the thermal nitridation/oxidation method of the instant invention. Dielectric layer 64 may be comprised of thermal nitridation, thermal oxidation, a stack of the two, or any combination of the two.

FIG. 2 illustrates field isolation regions 54 and four word line/pass gates 14. While illustrated with field isolation 54, it is also noted that other isolation techniques such as trench isolation can be used. Pass transistors 14b and 14c will form the gates of the two memory cells which will be illustrated in these drawings. Word lines 14a and 14d, on the other hand, will serve as the pass transistors for gates in other rows of the device.

Storage plate plugs 28 are formed. Regions 28 can be formed, for example, by depositing a layer of oxide material over the word lines 14 and then etching contact holes through the oxide of 60. A self-aligned contact etch can be performed by first surrounding each word line 14 with a nitride (not shown) and etching the overlying oxide 60. Plugs 28 can be formed from polysilicon or a metal.

As illustrated, in this example, the two memory cells being fabricated will share a single bit line 18. While it is not critical to this invention, the bit line may comprise any conductive material such as metal silicide, silicon or a metal.

An insulating layer 62 is formed over the bit lines 18. Using standard patterning and etching techniques, a contact hole is formed through insulating layer 62 to expose plug 28. Subsequently a second conductive layer 30 is formed over the insulating layer and so as to contact plugs 28. The conductive layer 30 preferably comprises a metal or metal nitride. Using standard patterning and etching techniques, a masking layer is patterned so as to protect the portion of layer 30 which will become part of the storage node 22. The masking layer and conductive layer 30 are then etched to create the portion of the storage node 22 structure.

A second conductive layer 36 is formed over the structure. The layer 36 can then be anisotropically etched so as to leave side walls. A cylindrical storage node 22 remains. The nitridation process described earlier can now be performed.

It is noted that a number of additional steps will be required before the DRAM device is completed. Since these steps are not critical to the present invention, they will not be described here beyond the acknowledgment of their existence.

Figure 3A:
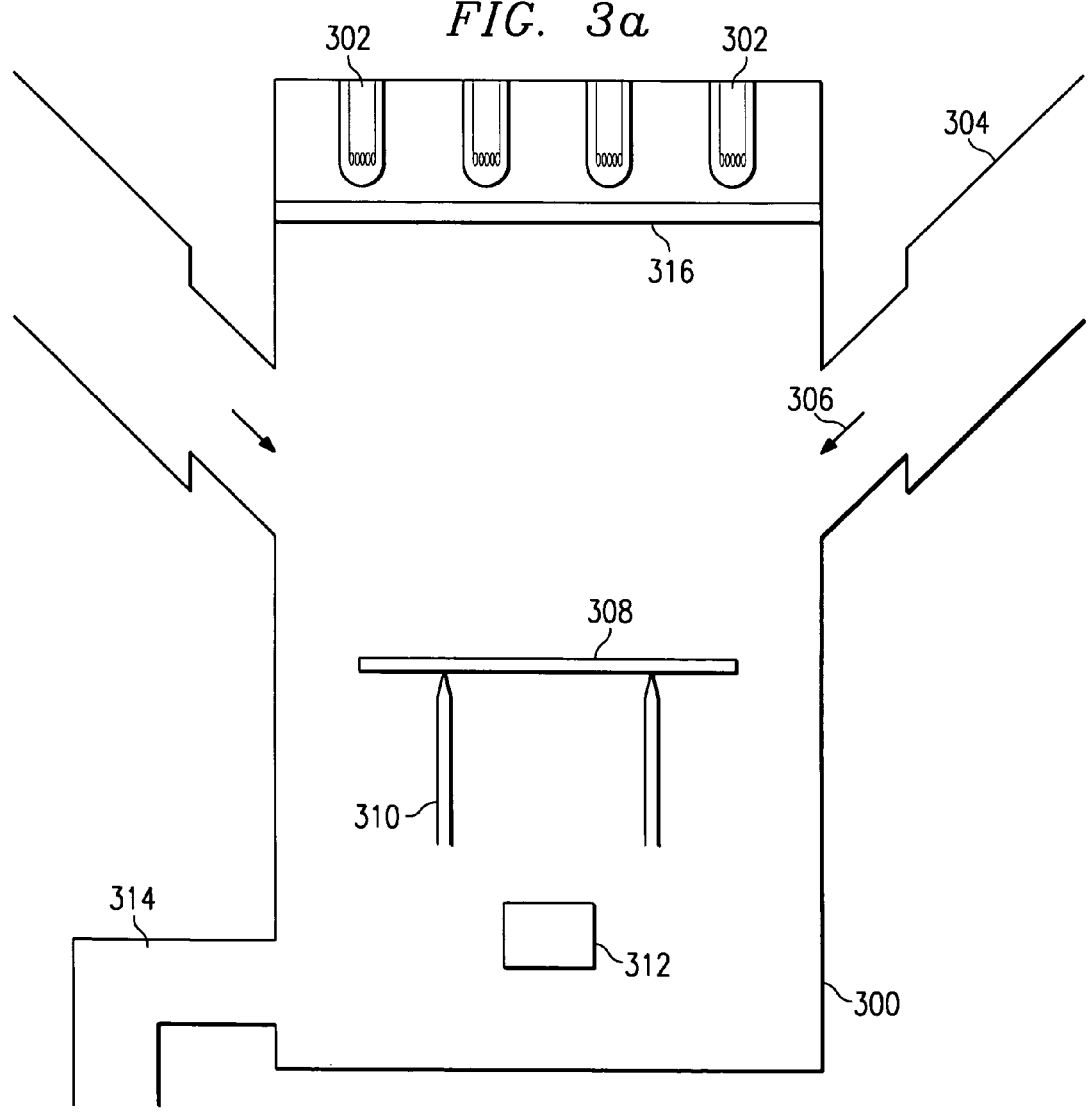
FIG. 3a is a cross-sectional view of a remote plasma processing tool of one embodiment of the instant invention.
Figure 3B:
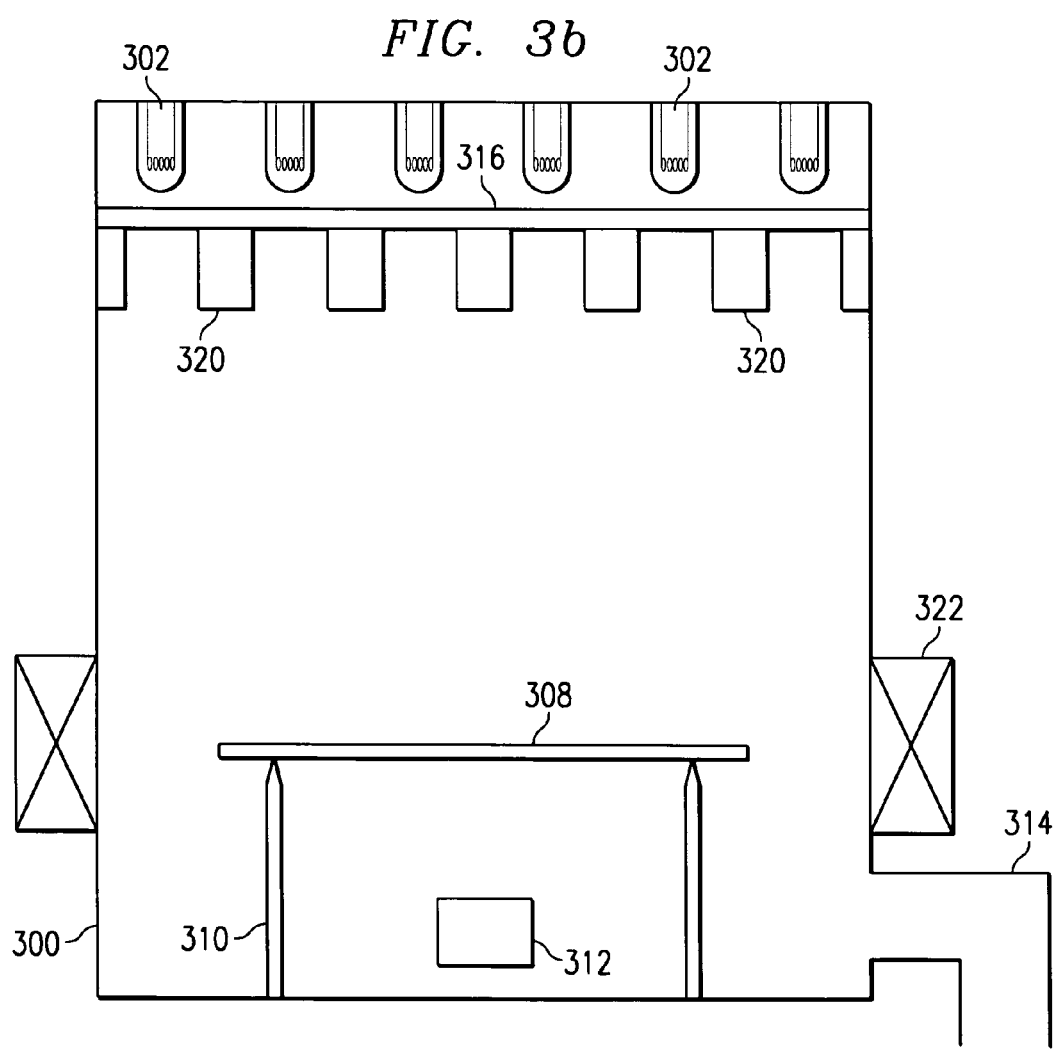
FIG. 3b is a cross-sectional view of a proximity plasma processing tool of another embodiment of the instant invention. The novel processing tools of these embodiments can be used to implement the method of the instant invention.

FIGS. 3a and 3b illustrate two embodiments of the instant invention. The process equipment of FIG. 3a involves the generation of a plasma remotely and then impinging the plasma onto the wafer. FIG. 3b, on the other hand, involves the generation of the plasma directly above the wafer surface. Similar reference are used in these figures to illustrate like or equivalent features. Referring to FIG. 3a, wafer 308 is supported by thermally isolated supports 310 inside of processing chamber 300, which is capable of containing a high vacuum (via vacuum port 314). The wafer is preferably heated from above using radiative heat sources 302, but it may also be heated from underneath using a thermally conductive chuck, for example. Preferably, heat sources 302 are tungsten halogen lamps or backbody radiators and are formed in an array so as to evenly heat the surface of wafer 308. Quartz window 316 allows radiation to reach wafer 308 while maintaining the high vaccum conditions within the chamber. Pyrometer detector 312 senses wafer temperature and provides signals to a closed loop control system for controlling the electrical power to radiative heat source 302 so as to control the ambient temperature of chamber 300.

Preferably, reactive gas 306 is introduced into the chamber through remote plasma sources 304, which may be comprised of high density plasma sources such as an ECR, ICP, or Helicon sources and which can have a direct line of sight to the wafer or not. Plasma sources 304 are preferably inductively coupled coil type sources or, for a high density plasma, wave heated ECR/Helicon type sources. To promote a net flow of plasma gas from the plasma source to the wafer, a pressure differential is preferably maintained between the gas pressure inside the plasma sources and the gas pressure inside the process chamber.

Referring to FIG. 3b, the elements that are identical or equivalent to elements in FIG. 3a have the same reference numerals and a discussion of these elements are not replicated below. The difference between the devices of FIGS. 3a and 3b are discussed below. Since the plasma is generated within chamber 300 for the device of FIG. 3b, the plasma source needs to be close to or within chamber 300. For example, coils 320 and 322 are included so as to generate the plasma above wafer 308. In addition, a nitrogen and/or oxygen containing source is preferably supplied into the chamber so as to form the nitrogen and/or oxygen containing plasma within chamber 300.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What I claim is:

1. A method of forming a dielectric layer on a silicon-containing structure, said method comprising the steps of:
   providing, to a silicon-containing structure, a gas comprising a mixture of nitrogen and oxygen;
   heating said silicon-containing structure to an elevated temperature greater than 700 C; and
   striking a plasma above said silicon-containing structure to cause thermal nitridation and thermal oxidation of a portion of said silicon-containing structure.

2. The method of claim 1, wherein said elevated temperature is greater than 900 C.

3. The method of claim 1, wherein said elevated temperature is greater than 1000 C.

4. The method of claim 1, wherein said silicon-containing structure is a silicon substrate and a gate dielectric is formed from the thermal nitridation and thermal oxidation of said silicon-containing structure.

5. The method of claim 1, wherein said silicon-containing structure is a bottom electrode of a storage capacitor of a memory device and a capacitor dielectric is formed from the thermal nitridation and thermal oxidation of said silicon-containing structure.

6. A method of forming an electrical device which has a dielectric formed between a bottom structure and a top structure, said method comprising the steps of:
   providing a gas comprising a mixture of nitrogen and oxygen over a bottom structure;
   heating said bottom structure at an ambient temperature at least 900 C;
   creating a plasma over said bottom structure to cause thermal nitridation and thermal oxidation of said bottom structure so as to form a dielectric over said bottom structure; and
   forming a top structure over said dielectric.

7. The method of claim 6, wherein said bottom structure is a silicon substrate and said top structure is a gate structure.

8. The method of claim 6, wherein said bottom structure is a bottom electrode of a storage capacitor of a memory device.

9. The method of claim 6, wherein said ambient temperature is around 1000 C.

10. A method of forming a gate dielectric layer on a semiconductor substrate, said method comprising the steps of:
    providing a gas comprised of a mixture of nitrogen and oxygen;
    heating said semiconductor substrate to an elevated temperature greater than 900 C;
    subjecting said semiconductor substrate to a plasma, wherein the combination of said gas, said elevated temperature, and said plasma result in thermal nitridation and thermal oxidation of a portion of said semiconductor substrate; and
    forming a gate electrode over said nitrided and oxidized portion of said semiconductor substrate.

* * * * *